United States Patent [19]

Fensch

[11] Patent Number: 5,319,316
[45] Date of Patent: Jun. 7, 1994

[54] NEGATIVE FEEDBACK CMOS DIFFERENTIAL AMPLIFIER OPERATING IN COMMON MODE

[75] Inventor: Thierry Fensch, Grenoble, France

[73] Assignee: SGS-Thomson Microelectronics S.A., Pouilly, France

[21] Appl. No.: 100,554

[22] Filed: Jul. 30, 1993

[30] Foreign Application Priority Data

Jul. 30, 1992 [FR] France .................. 92 09795

[51] Int. Cl.$^5$ ............................................ H03F 3/45
[52] U.S. Cl. .................................... 330/253; 330/258
[58] Field of Search ............... 330/253, 258, 260, 84, 330/85, 293, 294, 295; 307/491, 494

[56] References Cited

U.S. PATENT DOCUMENTS

| | | | |
|---|---|---|---|
| 4,213,098 | 7/1980 | Tsividis | 330/258 |
| 4,533,876 | 8/1985 | Haque et al. | 330/253 |
| 4,573,020 | 2/1986 | Whatley | 330/258 |
| 4,697,152 | 9/1987 | Westwick | 330/253 |
| 4,992,755 | 2/1991 | Seevinck et al. | 330/253 |
| 4,996,498 | 2/1991 | Hanna | 330/258 |

FOREIGN PATENT DOCUMENTS 2938543 4/1981 Fed. Rep. of Germany .

OTHER PUBLICATIONS

IEEE Journal of Solid-State Circuits, vol. 25, No. 2, Apr. 1991, New York, pp. 546–554, Tomasini et al., "A Fully Differential CMOS Line Driver for ISDN".

IEEE Journal of Solid-State Circuits, vol. 25, No. 6, Dec. 1990, New York, pp. 1414–1425, Batruni et al., "Mixed Digital/Analog Signal Processing for a Single-Chip 2B1Q U-Interface Transceiver".

Primary Examiner—James B. Mullins
Assistant Examiner—J. Dudek
Attorney, Agent, or Firm—Wolf, Greenfield & Sacks

[57] ABSTRACT

In a CMOS amplifier having a differential input and differential output, the input stage includes two legs, each of which includes an input transistor. A common mode negative feedback stage includes a load connected to the high supply voltage, a first transistor connected between the load and a common terminal of the input transistors. The first transistor is biased to the desired common mode voltage. A second transistor is connected between the load and the low supply voltage, and has a gate connected to a voltage corresponding to the means voltage of the output stage. An additional transistor is disposed in parallel with each input transistor. Each additional transistor has its gate connected to the desired common mode voltage.

5 Claims, 3 Drawing Sheets

NEGATIVE FEEDBACK CMOS DIFFERENTIAL AMPLIFIER OPERATING IN COMMON MODE

BACKGROUND OF THE INVENTION

Field of the Invention

The present invention relates to the field of amplifiers having differential input and output, fabricated in CMOS technology with N-channel and P-channel transistors.

Discussion of the Related Art

FIG. 1A schematically shows such an amplifier with differential input and output. A differential amplifier 10 is provided with two symmetrical inputs e+ and e− and two symmetrical outputs S+ and S−. Generally, a resistive or capacitive load, including a medium tap M, is provided between outputs S+ and S−. Voltages S+ and S− are symmetric with respect to voltage VM at the medium tap M. Such a circuit is coupled between a high supply terminal Vdd and a low supply terminal Vss. If VM is close to one of those limit values, the output voltage range is significantly reduced. Therefore, it is desired that VM is close to an optimal common mode voltage, VCM, that should have a value close to (Vdd−Vss)/2.

This type of amplifier is frequently used so-called switched-capacitor circuits. An exemplary circuit, forming a conventional integrator, is illustrated in FIG. 1B. This circuit, known per se, will not be described in detail. It should be noted that this circuit includes high frequency controlled switches, some of which, referenced 1, are switched during a first phase of a clock signal, and some others, referenced 2, are switched during a complementary phase of the clock signal. Negative feedback capacitors, Cr, are permanently connected between the complementary inputs and outputs of the differential amplifier 10. Switched capacitors Ca and Cb have values that are much lower than the values of the negative feedback capacitors Cr.

FIG. 2 shows, by way of example, an embodiment of a two-stage amplifier having differential input and output. In the following description, MN designates an N-channel MOS transistor and MP designates a P-channel MOS transistor.

The input differential stage includes two MOS transistors, MN1 and MN2, respectively receiving at their gate the differential input signals e+ and e−. The drains of the input transistors are connected, through respective loads, to the high supply terminal Vdd. FIG. 2 illustrates a cascode-type stage, including two cascode transistors MN3 and MN4 whose gates are connected to a polarization source P1, and two charge transistors MP5 and MP6 whose gates are connected to a polarization source P2. The drawing shows in more detail that the source of MN3 is connected to the drain of MN1, the drains of MP5 and MN3 are interconnected, and the source of MP5 is connected to Vdd. Similarly, the source of MN4 is connected to the drain of MN2, the drains of MN4 and MP6 are interconnected, and the source of MP6 is connected to Vdd. Polarization P1 is applied to the gates of MN3 and MN4, and polarization P2 is applied to the gates of MP5 and MP6.

The outputs of this input differential stage, that are drawn from the common nodes of drains of transistors MN3 and MP5 and of transistors MN4 and MP6, respectively, are amplified by an output differential stage including transistors MP7 and MP8 whose sources are connected to Vdd and the drains to the low supply voltage Vss through respective current sources MN9 and MN10. The gates of transistors MN9 and MN10 are connected to a polarization voltage P3 that is also applied to the gate of a transistor MN11 connected between the common sources of transistors MN1 and MN2 and voltage Vss. The differential outputs S− and S+ of the circuit correspond to the drains of transistors MP7 and MP8, respectively.

In CMOS technology using a P-type substrate, each P-channel MOS transistor is fabricated in a well N. Well N is connected to the source of the transistor, that is, frequently, at voltage Vdd.

FIG. 2 also represents the medium tap M between identical output impedances Z1 and Z2. An asymmetry between inputs e+ and e− with respect to a predetermined common mode voltage VCM causes an offset of voltage VM at medium tap M with respect to the predetermined common mode voltage VCM.

Capacitors C1 and C2 operate as a stabilization circuit and are respectively connected between the drains of transistors MN1 and MP7 and between the drains of transistors MN2 and MP8.

Those skilled in the art will notice that the described circuit is only illustrative of a double differential stage and that many modifications can be made. For example, cascode transistors MN3 and MN4 can be eliminated; then, a series resistor should be added to the stabilization capacitors C1 and C2. Many other variants can be devised to improve the circuit's consumption, or its sensitivity to temperature variations.

To cancel the offset of voltage VM with respect to voltage VCM, realignment circuits, also referred to as common mode negative feedback circuits, are also provided in the prior art.

In the prior art, this negative feedback is often provided at the output stage, which exhibits some drawbacks, among which:

the occurrence of a parasitic negative feedback loop between the output stage and the input stage which involves providing additional stabilization circuits, the power consumption of the negative feedback stage is not negligible since it has to provide currents as high as the currents in the output stage.

There has also been suggested to provide the common mode negative feedback at the input stage. U.S Pat. No. 4,697,152 teaches such an approach. The common mode negative feedback is made on the charge transistors of the differential stage. Further to the detection of a common mode offset, one acts on the gates of the charge transistors of each of the differential legs. This solution also presents many drawbacks. First, it introduces a feedback time constant because the gate capacitances of the transistors on which it is acted introduce a delay time. Second, it complicates, or makes it impossible, the use of a charge stage of the cascodetype.

A second solution for introducing a common mode feedback on the input stage is suggested in an article by Roy Batruni, Pierre Lemaître and Thierry Fensch, published in "IEEE Journal of solid-state circuits", vol. 25, No. 6, December 1990, pp. 1414–1425. This solution avoids the drawbacks relating to the time constant and the difficulty of inserting a cascode stage as in the former solution but presents other drawbacks that will be explained hereinafter.

SUMMARY OF THE INVENTION

An object of the invention is to provide a common mode negative feedback circuit that avoids the drawbacks of the last indicated solution.

To achieve this object, the invention provides for combining a common mode negative feedback circuit with the input stage of the differential amplifier. The compensation is made by a circuit leg in parallel with the legs of the input differential stage and adjusts the current in the input legs as a function of the common mode offset. A MOS transistor permanently maintained in a conductive state being parallel connected with each input transistor.

More particularly, the invention provides a CMOS amplifier having differential input and output including at least two stages, in which the input stage includes two legs, each of which includes an input transistor having a first terminal connected to a high supply voltage through a respective load and a second terminal connected to the low supply voltage through a common load. A common mode negative feedback stage includes a load connected to the high supply voltage, a first transistor connected between the load and the common terminal of the input transistors. The first transistor is biased to the desired common mode voltage, and a second transistor is connected between the load and the low supply voltage, its gate being connected to a voltage corresponding to the mean voltage of the output stage. An additional transistor is disposed in parallel with each of the input transistors, those additional transistors having their gates connected to the desired common mode voltage.

According to an embodiment of the invention, the loads of the input legs and of the negative feedback stage are formed by MOS transistors having a common gate.

According to an embodiment of the invention, the loads of the input transistors of the input stage further include cascode-connected transistors.

According to an embodiment of the invention, the input transistors and the additional transistors are N-channel MOS transistors.

The foregoing and other objects, features, aspects and advantages of the invention will become apparent from the following detailed description of the present invention when taken in conjunction with the accompanying drawings.

DETAILED DESCRIPTION

Figure 3:
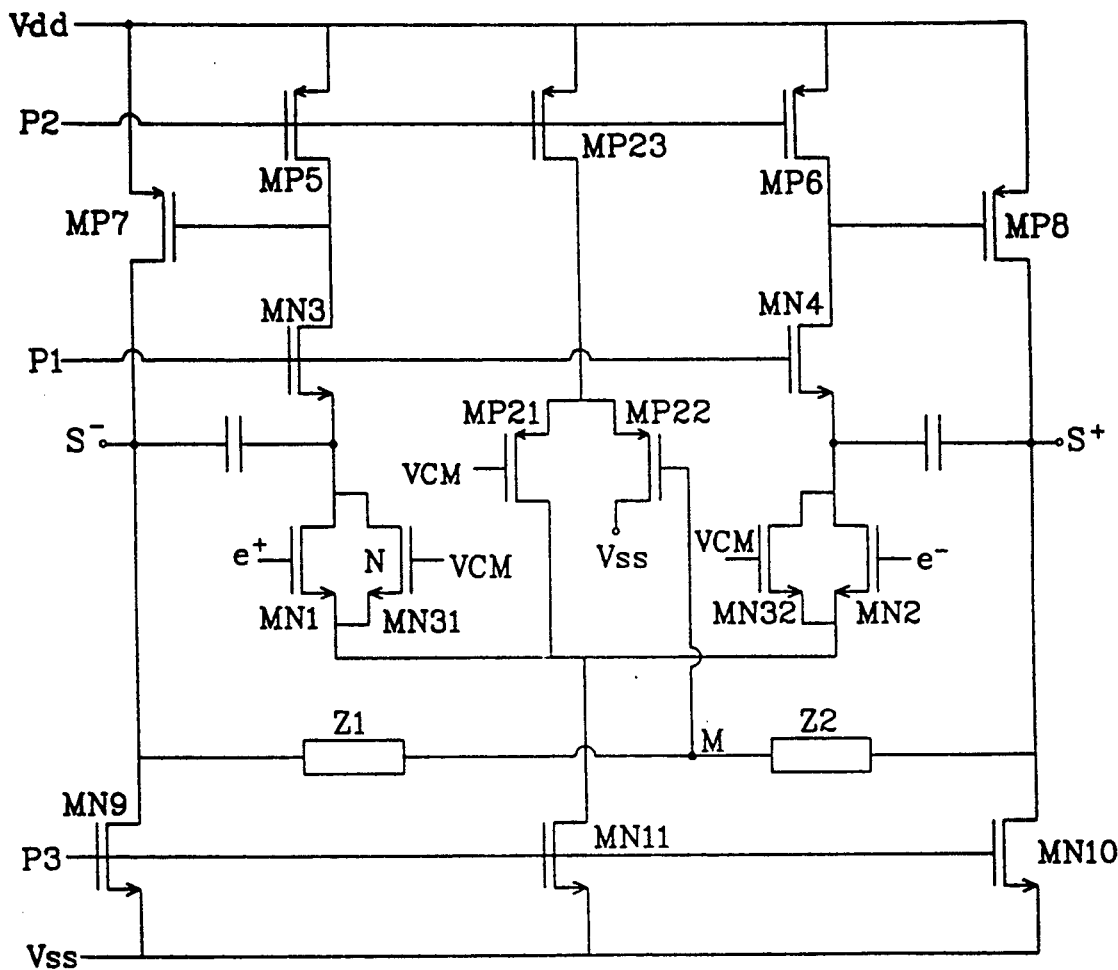
FIG. 3 represents an embodiment of a circuit according to the invention.

The circuit shown in FIG. 3 corresponds, in part, to the circuit of FIG. 5 of the above-mentioned article of IEEE Journal. In connection with FIG. 3, the structure and the operation of the circuit will be reminded. Then, a drawback of this circuit, avoided by the invention, will be indicated.

FIG. 3 shows an input stage associated with a common mode negative feedback stage including transistors MP21, MP22 and MP23 connected in a relatively conventional way for those skilled in the art, that is, transistors MP21 and MP22 are connected substantially as a differential stage, their sources being interconnected and connected to the high supply voltage Vdd through a load transistor MP23 whose gate is interconnected with the gates of transistors MP5 and MP6. The drain of transistor MP21 is connected to the common sources of transistors MN1 and MN2, and the gate of transistor MP21 is connected to the desired common mode voltage VCM. The drain of transistor MP22 is connected to the low supply voltage Vss and the gate of transistor MP22 is connected to the medium tap M. Preferably, the surface area of transistor MP23 is within a ratio k1 with respect to the surface area of transistors MP5 and MP6 so that, when each transistor MP5 and MP6 conducts a current I1, transistor MP23 conducts a current k1×I1. Ratio k1 can, for example, be equal to 1. Similarly, transistor MN11 is selected within a determined surface area ratio k2 with respect to transistors MN9 and MN10 to limit the current in the input stage so that, when a current I2 flows through transistors MN9 and MN10, a current of approximately k2×I2 flows through transistor MN11. Ratio k2 is, for example, equal to 2.5.

The above-described feedback stage operates as follows. When voltages e+ and e− are balanced with respect to VCM and when VM=VCM, the current in transistor MN11 is equal to k2×I2 and is equal to the sum of the currents in transistors MN1 and MN2 (2I1) and of the current in transistor MP21. The current of transistor MP21 is equal to k1×I1/2 since current I1 in transistor MP23 is equally distributed among transistors MP21 and MP22 that have the same gate voltage. If the voltages of inputs e+ and e− are both offset in the same direction (and not symmetrically as they normally do), the output voltages S+ and S− are offset in the same direction and voltage VM is no longer equal to voltage VCM. If, for example, e+ and e− are positively offset, VM increases, whereby transistor MP22 becomes less conductive and more drain current of transistor MP23 will flow through transistor MP21. Since the sum of the currents in MN1, MP21 and MN2 is constant and fixed by the polarization of transistor MN11, this current increase in transistor MP21 causes a current decrease in transistors MN1 and MN2, which provides for the desired compensation (or negative feedback).

The above disclosed circuit, that corresponds to FIG. 5 of the IEEE Journal article, has a drawback that limits its usefulness. Indeed, such circuit does not operate and blocks the system when the two voltages e+ and e− simultaneously drop to the low value Vss. This situation can occur, for example, due to the occurrence of a parasitic pulse on the input conductors, which is not an exceptional situation in practice.

Figure 1A:
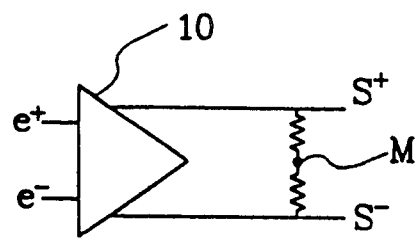
FIGS. 1A, 1B and 2, a described, illustrate the state of the art.
Figure 1B:
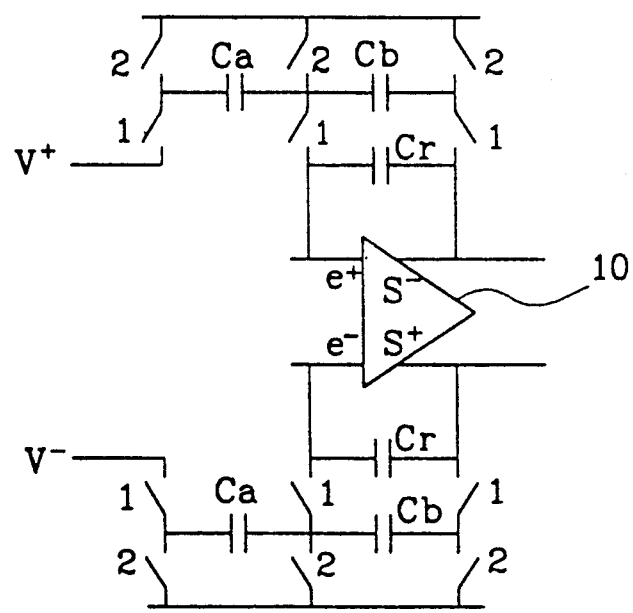
Figure 2:
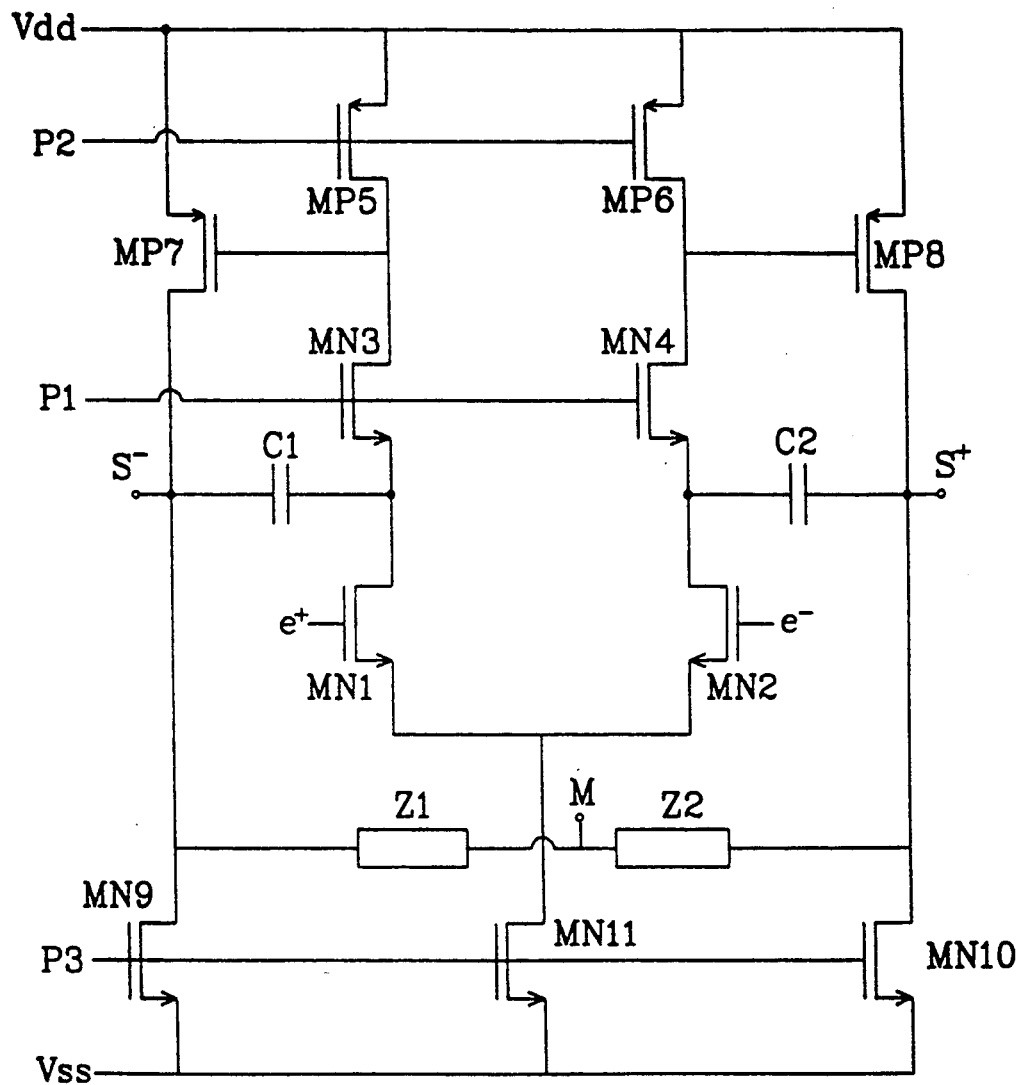

Blocking results from the fact that, if both inputs e+ and e− drop to Vss, the two transistors MN1 and MN2 are blocked, which causes blocking of transistors MP7 and MP8 and therefore the drop of voltage VM to a value close to Vss. Transistor MP22 is then fully conductive and derives practically the whole current from transistor MP23. Once triggered, this state is maintained because the voltage of inputs e+ and e− cannot rise to a value sufficiently high to repolarize the input stage correctly. Indeed, the negative feedbacks that always exist in practice in a differential amplifier circuit have a dominant effect with respect to the progressive increase of inputs e+ and e−. This is especially the case in switched capacitor circuits where the negative feedback impedances between the inputs and outputs of the differential amplifier (refer to capacitors Cr of FIG. 1B) have high value and where voltages e+ and e− result from the charge of the capacitors (refer to Ca in FIG. 1B) having a low value. A blocking state is effectively achieved.

The invention proposes to modify the known common mode negative feedback circuit disposed at the input stage while avoiding the above-mentioned blocking state.

To achieve this object, the invention provides for disposing in parallel with each input transistor MN1 and MN2 of the input stage a parallel transistor, MN31, MN32, respectively, the gates of the parallel transistors being connected to the common mode reference voltage VCM.

Thus, if both voltages e+ and e− drop, the legs of the input differential stage remain conductive through transistors MN31 and MN32; so, the simultaneous drop to zero of the two outputs S+ and S− is avoided. Voltage VM at the medium tap M remains higher than a threshold determined especially by the relative surface area of transistors MN31 and MN32 and surface area of transistors MN1 and MN2.

As is apparent to those skilled in the art, various modifications can be made to the above disclosed preferred embodiment. In particular, the N-channel and P-channel MOS transistors can be interchanged provided that the high and low voltages, Vss and Vdd, are also interchanged.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A CMOS amplifier, with at least two-stages, a differential input and a differential output, comprising a common mode negative feedback circuit coupled to an input stage, and MOS transistors permanently maintained in a conductive state and disposed in parallel with each input transistor of the input stage.

2. A CMOS amplifier with at least two stages, a differential input and a differential output, in which an input stage includes two legs, each of which includes an input transistor having a first terminal connected to a high supply voltage through a respective load and a second terminal connected to the low voltage through a common load, said amplifier comprising:

a common mode negative feedback stage comprising a load connected to the high supply voltage, a first transistor connected between the load and a common terminal of the input transistors, said first transistor being biased to a desired common mode voltage, and a second transistor connected between said load and said low supply voltage, and having a gate connected to a voltage corresponding to a mean voltage of an output stage, and an additional transistor disposed in parallel with each input transistor, each additional transistor having a gate connected to the desired common mode voltage.

3. The differential amplifier of claim 2, wherein the loads of the input legs and of the negative feedback stage are formed by MOS transistors having a common gate.

4. The differential amplifier of claim 3, wherein the loads of the input transistors of the input stage further include cascode connected transistors.

5. The differential amplifier of claim 4, wherein the input transistors and the additional transistors are N-channel MOS transistors.

* * * * *